US010896994B1

(12) United States Patent
Shipton et al.

(10) Patent No.: US 10,896,994 B1
(45) Date of Patent: Jan. 19, 2021

(54) LIGHT-EMITTING DIODE WITH HYPERBOLIC METAMATERIAL

(71) Applicant: Facebook Technologies, LLC, Menlo Park, CA (US)

(72) Inventors: Erik Shipton, Kenmore, WA (US); Tanya Malhotra, Redmond, WA (US)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 16/384,759

(22) Filed: Apr. 15, 2019

(51) Int. Cl.
*H01L 33/06* (2010.01)
*H01L 27/15* (2006.01)
*G02B 5/00* (2006.01)
*H01L 33/00* (2010.01)

(52) U.S. Cl.
CPC .............. *H01L 33/06* (2013.01); *G02B 5/008* (2013.01); *H01L 27/156* (2013.01); *H01L 33/0062* (2013.01); *H01L 2933/0083* (2013.01)

(58) Field of Classification Search
CPC ... H01L 33/06; H01L 27/156; H01L 33/0062; H01L 2933/0083; H01L 33/04–06; H01L 51/50–56; H01L 33/00–648; H01L 27/15–156; G02B 5/008
See application file for complete search history.

(56) References Cited

U.S. PATENT DOCUMENTS

2017/0179334 A1* 6/2017 Liu .................... H01L 51/5048
2019/0386173 A1* 12/2019 Chen .................. H01L 33/0079

OTHER PUBLICATIONS

"Luminescent hyperbolic metasurfaces" Smalley et al. Nature Communications published Jan. 9, 2017.
"Nanostructuring Multilayer Hyperbolic Metamaterials for Ultrafast and Bright Green InGaN Quantum Wells" Lu et al. Advanced Materials Nov. 3, 2017.
"Shockley-Read-Hall and Auger non-radiative recombination in GaN based LEDs: A size effect study" Olivier et al. Applied Physics Letters 111 (2017).
Hyperbolic metamaterials: fundamentals and applications: Shekhar et al. Nano Convergence (2014).
"The ABC model of recombination reinterpreted: Impact on understanding carrier transport and efficiency droop in InGaN/GaN light emitting diodes" Hopkins et al. Journal of Applied Physics 122 (2017).

* cited by examiner

*Primary Examiner* — Shahed Ahmed
(74) *Attorney, Agent, or Firm* — Matthew A. Pequignot; Pequignot + Myers

(57) ABSTRACT

A light-emitting diode includes a first semiconductor region of one of p- or n-conductivity types, a second semiconductor region of the other one of p- or n-conductivity types, forming a p-n junction with the first semiconductor region, and a quantum well layer at the p-n junction between the first and second semiconductor regions. A hyperbolic metamaterial structure is provided in the second semiconductor region. The hyperbolic metamaterial structure is coupled to the quantum well layer for extracting light from the quantum well layer. The hyperbolic metamaterial structure may be patterned to provide an array of nanoantennas to apodize the emitted beam, and to control the polarization state of the emitted beam.

18 Claims, 13 Drawing Sheets

FIG. 13A
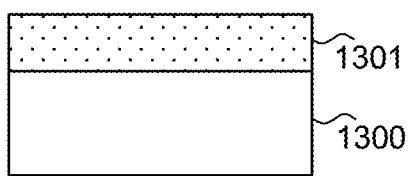
FIG. 13B
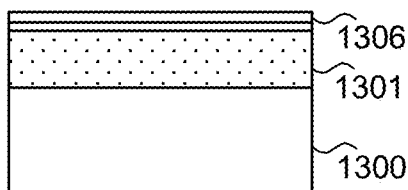
FIG. 13C
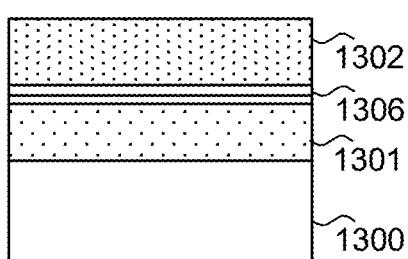
FIG. 13D
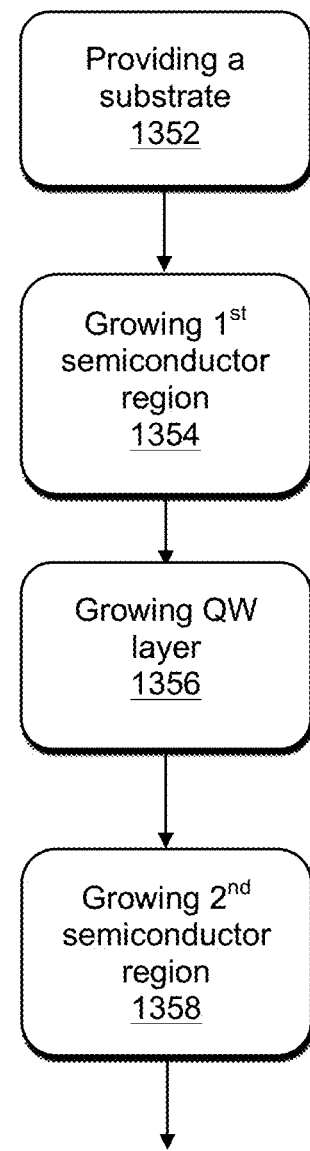

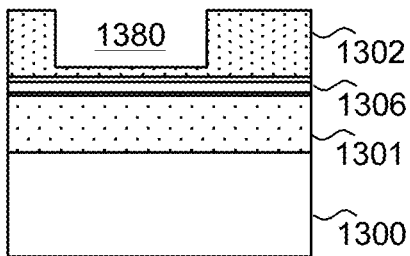
FIG. 13E
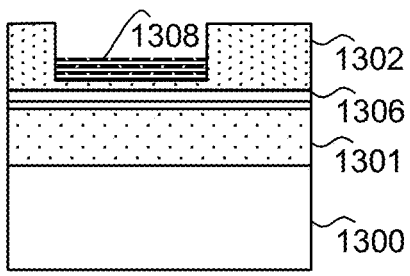
FIG. 13F
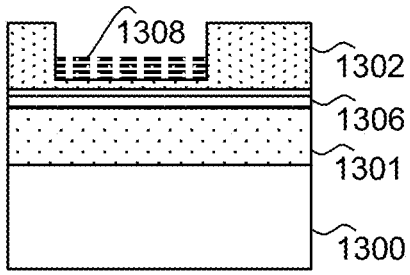
FIG. 13G
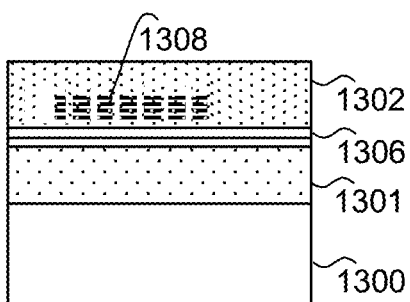
FIG. 13H
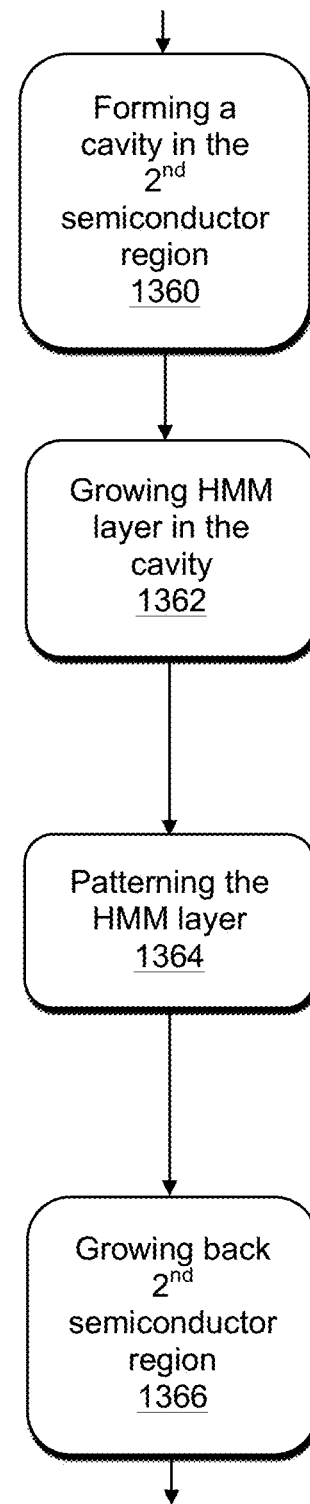

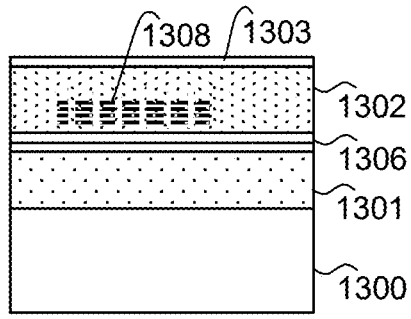
FIG. 13I
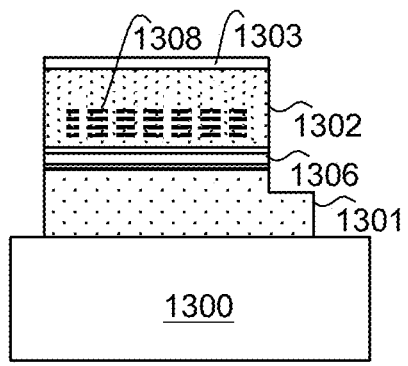
FIG. 13J
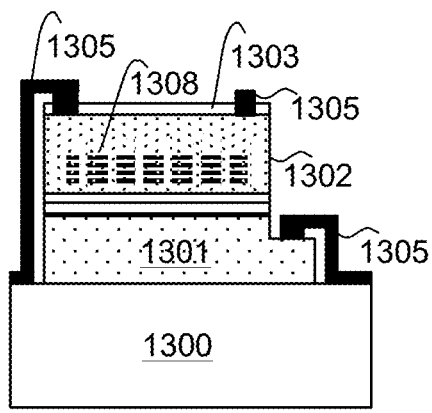
FIG. 13K
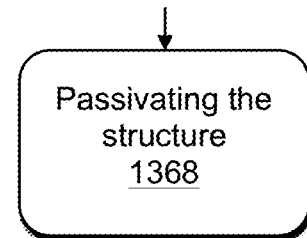
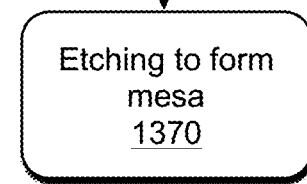
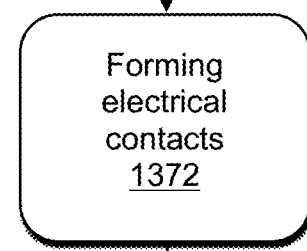

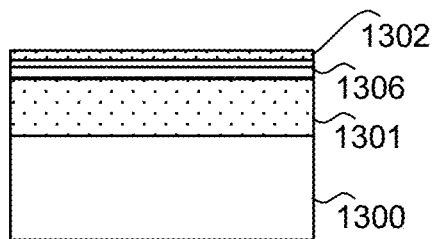
FIG. 14A
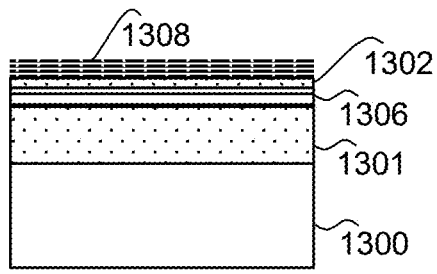
FIG. 14B
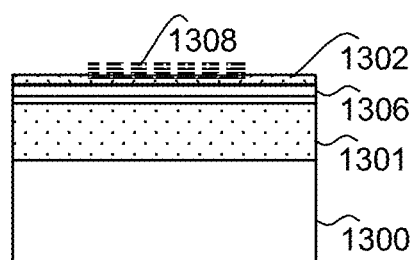
FIG. 14C
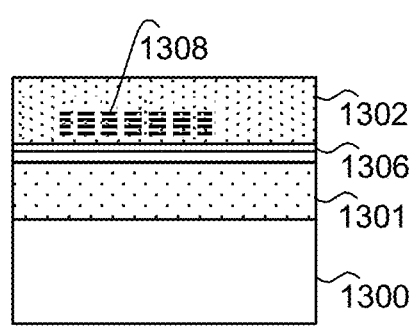
FIG. 14D
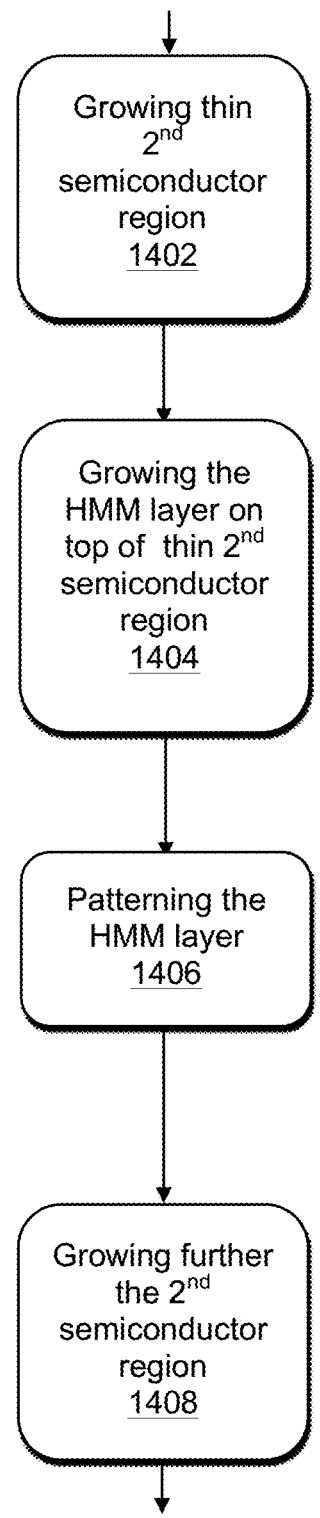

LIGHT-EMITTING DIODE WITH HYPERBOLIC METAMATERIAL

TECHNICAL FIELD

The present disclosure relates to optical components and modules, and in particular to light-emitting diodes and light-emitting diode arrays.

BACKGROUND

Light-emitting diodes (LEDs) are promising light sources for lighting, display applications, indicators on instrument panels, etc. A growing interest in wearable devices and their numerous applications (augmented reality, virtual reality displays, etc.) created a need for high-efficiency, miniature visual display devices. Miniature visual display panels can be used in head-mounted displays (HMDs), near-eye displays (NEDs), and other wearable displays, and may enable reduction of size and weight of the HMDs and NEDs.

An efficiency of an LED is determined by a ratio of radiative and non-radiative recombination of electrons and electron holes at a p-n junction of the LED. The non-radiative recombination rate typically increases as the size of an LED pixel decreases. One reason for this is a comparatively high density of surface states. Smaller LED pixels present higher current densities, which may cause possible non-radiative recombination of carriers and/or high leakage current of the LED. It is also known that LED edges may act as a strong perturbation of the periodicity of a crystal lattice. This induces electronic states within the semiconductor gap that become non-radiative recombination centers in small LED chips. Due to these deleterious effects, a miniature LED display panel may suffer from a comparatively low conversion efficiency and, consequently, low image brightness, high energy consumption, overheating, etc. Low image brightness and high energy consumption may limit the use of LED panels in HMDs, NEDs, head-up displays, and other display systems.

SUMMARY

In accordance with the present disclosure, there is provided a light-emitting diode (LED) comprising a first semiconductor region of one of p- or n-conductivity types. A second semiconductor region of the other one of p- or n-conductivity types forms a p-n junction with the first semiconductor region. A quantum well layer is provided at the p-n junction between the first and second semiconductor regions. A hyperbolic metamaterial structure in the second semiconductor region is coupled to the quantum well layer.

The hyperbolic metamaterial structure may include a stack of alternating metal and semiconductor layers. The LED may have lateral dimensions of no greater than 25×25 micrometers, for example.

The hyperbolic metamaterial structure may include an array of features coupled to the quantum well layer. The array of features may have a plasmonic resonance optical frequency within a spectral gain band of the quantum well layer. The array of features may have a spatially variant pitch and/or a spatially varying duty cycle. A between the quantum well layer and features of the array may vary across the array.

In some embodiments, the array of features is two-dimensional. Each feature of the array may include at least one of a cylinder feature, a cross feature, or a chevron feature, for example. The array may include a plurality of sub-arrays of features, each sub-array comprising an array of grating lines. The features of the array may be configured to provide a pre-defined polarization of emitted light. Features of the array may extend from the quantum well layer and into the second semiconductor region. At least some of the features of the array may be inclined towards a center of the array.

In accordance with the present disclosure, there is provided a display device comprising an array of light-emitting diodes. Each light-emitting diode may include a first semiconductor region of one of p- or n-conductivity types; a second semiconductor region of the other one of p- or n-conductivity types, forming a p-n junction with the first semiconductor region; a quantum well layer at the p-n junction between the first and second semiconductor regions; and a hyperbolic metamaterial structure in the second semiconductor region. The hyperbolic metamaterial structure is coupled to the quantum well layer. The display device may further include an element having optical power optically coupled to the array of light-emitting diodes and spaced apart therefrom for redirecting optical beams emitted by the array of light-emitting diodes.

In some embodiments, the hyperbolic metamaterial structure includes an array of features coupled to the quantum well layer. At least some of the features of the array may be inclined towards center of the array.

In accordance with the present disclosure, there is further provided a method of manufacturing a light-emitting diode (LED). The method includes providing a die comprising: a first semiconductor region of one of p- or n-conductivity types; a second semiconductor region of the other one of p- or n-conductivity types forming a p-n junction with the first semiconductor region; and a quantum well layer at the p-n junction between the first and second semiconductor regions. The method further includes forming a hyperbolic metamaterial structure in the second semiconductor region such that the hyperbolic metamaterial structure is coupled to the quantum well layer. Forming the hyperbolic metamaterial structure in the second semiconductor region may include forming a cavity in the second semiconductor region, the hyperbolic metamaterial structure being formed in the cavity. In some embodiments, forming the hyperbolic metamaterial structure in the second semiconductor region may include growing a first portion of the second semiconductor region, forming the hyperbolic metamaterial structure on the portion, and growing a second portion of the second semiconductor region over the hyperbolic metamaterial structure.

BRIEF DESCRIPTION OF THE DRAWINGS

Exemplary embodiments will now be described in conjunction with the drawings, in which:

FIGS. 13A to 13K are side cross-sectional views of an LED of the present disclosure at various progressing stages of manufacture, superimposed with corresponding steps of a flow chart illustrating a corresponding method of manufacture of the LED;

FIGS. 14A to 14D are side cross-sectional views of an LED of the present disclosure at various progressing stages of manufacture in accordance with an alternative embodiment, superimposed with steps of a flow chart illustrating a corresponding alternative method of manufacture of the LED.

DETAILED DESCRIPTION

Figure 1A:
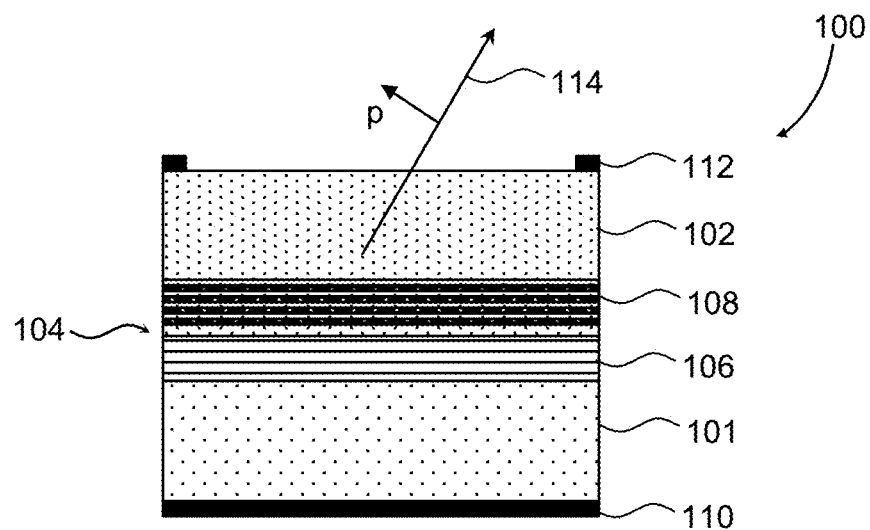
FIG. 1A is a side cross-sectional view of an LED including a hyperbolic metamaterial (HMM) structure in accordance with an embodiment of the present disclosure.

While the present teachings are described in conjunction with various embodiments and examples, it is not intended that the present teachings be limited to such embodiments. On the contrary, the present teachings encompass various alternatives and equivalents, as will be appreciated by those of skill in the art. All statements herein reciting principles, aspects, and embodiments of this disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

As used herein, the terms "first", "second", and so forth are not intended to imply sequential ordering, but rather are intended to distinguish one element from another, unless explicitly stated. Similarly, sequential ordering of method steps does not imply a sequential order of their execution, unless explicitly stated. In FIGS. 1A-1B, 2A-2B, FIGS. 4, 5, 6A-6B, FIGS. 7-10, 11A-11B, FIG. 12, FIGS. 13A-13K, and FIGS. 14A-14D, similar reference numerals denote similar elements.

In accordance with the present disclosure, a light emitting efficiency of an LED device may be increased by shortening a lifetime of excited energy states of electron-hole pairs in the LED's p-n junction by enhancing or accelerating radiative recombination of the electron-hole pairs. Such enhancement may be achieved by providing a hyperbolic metamaterial (HMM) structure in the vicinity of a quantum well layer at the p-n junction of the LED. For efficient energy transition from the quantum wells to the HMM structure, the latter may be configured to have a plasmonic resonance at an optical frequency within a spectral gain band of the quantum well layer. Furthermore, the HMM structure may be impedance-matched to a surrounding medium to facilitate radiative relaxation of surface plasmons and to increase the light output. The HMM structure may be patterned to provide an arrayed structure facilitating the emission of light at a certain pre-defined polarization(s), and/or in a certain pre-defined direction(s).

Figure 1B:
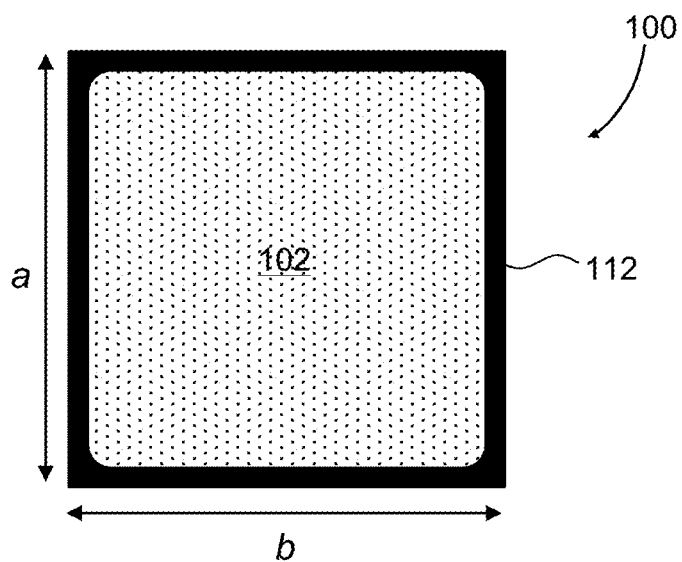
FIG. 1B is a top view of the LED of FIG. 1A.

Referring to FIGS. 1A and 1B, a light-emitting diode (LED) 100 includes a first semiconductor region 101 of n-type of conductivity and a second semiconductor region 102 of p-type of conductivity disposed on the first semiconductor region 101 and forming a p-n junction 104 with the first semiconductor region 101. In some embodiments, the LED 100 may be a silicon diode having n- and p-doped silicon semiconductor regions. Dopants for silicon LED 100 may include e.g. boron, gallium, aluminum, or indium (p-dopants), and arsenic, phosphorus, bismuth, antimony, or lithium (for n-dopants). In some embodiments, the LED 100 may be based on gallium nitride (GaN). Dopants for GaN LED 100 may include e.g. magnesium (p-dopant), and silicon, germanium, or carbon (n-dopants). These examples are non-limiting, and many other material combinations are possible.

A quantum well layer 106 is disposed at the p-n junction 104 between the first 101 and second 102 semiconductor regions. The quantum well layer 106 may include a multi-layer stack including e.g. gallium arsenide alternating with a material with a wider bandgap, like aluminum arsenide. Such structures can be grown by molecular beam epitaxy or chemical vapor deposition with control of the layer thickness down to monolayers, that is, a single-atom layers of materials. Thin metal films may also support quantum well states in some cases. Bottom 110 and top 112 electrodes may be provided in a suitable geometry. For example, the LED 100 has the bottom electrode 110 in form of a continuous layer, and the top electrode 112 as a frame around the perimeter of the second semiconductor region 102. Numerous other configurations are possible. Lateral dimensions a and b of the LED 100 (FIG. 1B) are small for miniature diodes, e.g. no greater than 25×25 micrometers, and even no greater than 10×10 micrometers. The bottom semiconductor region, i.e. the first semiconductor region 101 may be of p-type and the second or top semiconductor region 102 may be of n-type. More generally, the first semiconductor region 101 is of one of p- or n-conductivity types, and the second semiconductor region is of the other one of p- or n-conductivity types.

A hyperbolic metamaterial (HMM) structure 108 may be disposed in the second semiconductor region 102 and optically coupled to the quantum well layer 106. The HMM structure 108 may include a stack of interposed thin metal and dielectric, or metal and semiconductor layers, or metal, dielectric, and semiconductor layers. The materials and thicknesses of the layers may be selected such as to engineer a desired dielectric permittivity for emitted light 114 polarized in a plane p perpendicular to the metamaterial layers. In some embodiments, the hyperbolic metamaterial structure 108 includes interposed layers of metal such as gold or silver, and dielectric such as metal or semiconductor oxide, semiconductor such as silicon and dielectric, metal and semiconductor, etc. The metamaterial layer may include a plurality of nanoantennas disposed in a one-dimensional or two-dimensional array, and/or a plurality of nanowires e.g.

less than 20 nm to 700 nm long with a 10 nm to 75 nm in lateral dimension, with a separation between individual nanowires of below 100 nm. The nanowires may have a circular cross-section or a non-circular cross-section, such as a square, a rectangular, and/or an elliptical cross-section. Nanoantenna embodiments will be discussed further below.

In operation, a voltage is applied between the bottom 110 and top 112 electrodes with the higher electrical potential applied to the top electrode 112 and the lower electrical potential applied to the bottom electrode 110. This causes the p-n junction 104 to be forward biased, creating a force on the electrons pushing them from the first semiconductor region 101 toward the second semiconductor region 102. With forward bias, electrons enter the p-n junction 104 and recombine with holes at the quantum well layer 108. The quantum well layer 106 provides intermediate energy states where electrons and holes can radiatively recombine with each other. The hyperbolic metamaterial structure 108 may act to remove the radiated energy from the quantum wells 106. Due to this process, the HMM structure 108 shortens the carrier recombination lifetime and thereby increases the light conversion efficiency of the LED 100.

Figure 2A:
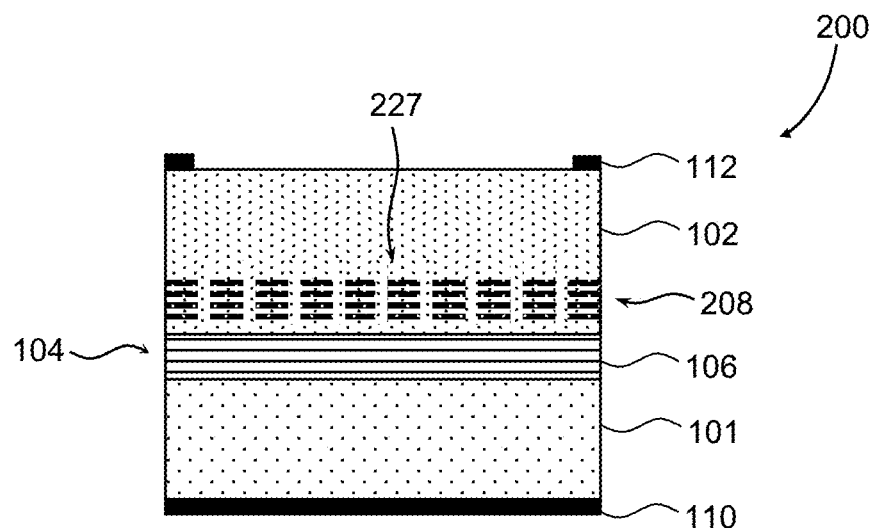
FIG. 2A is a side cross-sectional view of an LED including an HMM array.
Figure 2B:
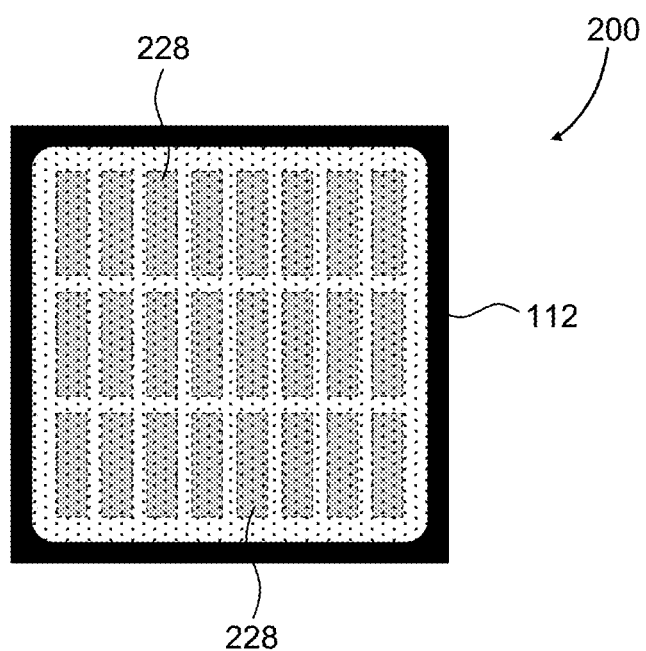
FIG. 2B is a top view of the LED of FIG. 2A.

Referring to FIGS. 2A and 2B, an LED 200 is an embodiment of the LED 100 of FIGS. 1A and 1B. An arrayed HMM structure 208 of the LED 200 of FIGS. 2A and 2B is similar to the MINI structure 108 of FIGS. 1A and 1B, in that it includes a stack of alternating metal-dielectric or metal-semiconductor layers. The arrayed HMM structure 208 of FIGS. 2A and 2B includes a two-dimensional array 227 of features 228 disposed in the second semiconductor region 102 and coupled to the quantum well layer 106. The features 228 may have a variety of sizes and shapes, e.g. rectangular as shown, polygonal, rhombic, square, circular, oval, etc., while retaining the basic multi-layer HMM structure. The desired pattern of the features 228 may be achieved e.g. by a selective etching process. The size, shape, and composition of the features 228 enables one to tune plasmonic resonance of the features 228, and therefore to further tune optical properties of the entire hyperbolic metamaterial structure 208 to match a pre-defined set of optical properties related to complex dielectric permittivity, polarization properties, etc. For example, the shape, size, and composition of the features 228 may be selected to provide a plasmonic resonance at wavelengths of color channels of a visual display, such as red, green, and blue channels. Furthermore, the spectral width and, to a certain degree, a spectral shape of the plasmonic resonance may be selected to match a pre-defined target value.

Figure 3:
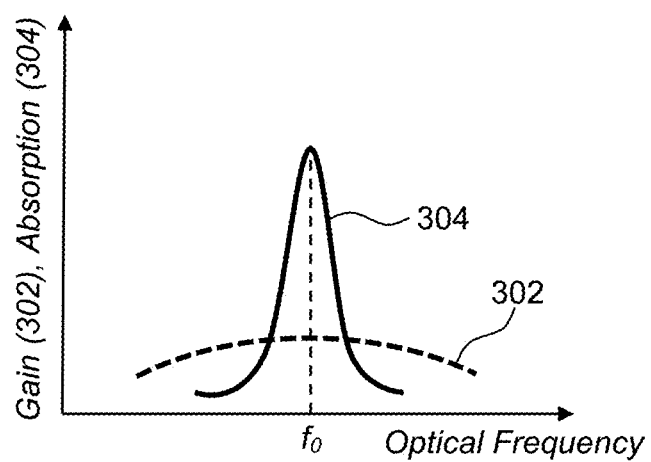
FIG. 3 is a plot of spectral gain of the LED's p-n junction superimposed with a plot of plasmonic resonance of the MINI array of FIGS. 2A and 2B.

Referring to FIG. 3, a spectral gain curve 302 of the p-n junction 104 of the LED 200 of FIGS. 2A and 2B is superimposed with with a plasmonic resonance absorption curve 304 of the arrayed HMM structure 208. For visible light LEDs, a full width at half maximum (FWHM) of the gain bandwidth may be about 40 nm, or approximately 43 THz for a green color channel centered at 530 nm. The plasmonic resonance FWHM depends on the materials used in the MINI stack. For example, when silver is used as the metal in HMM stack, the plasmonic resonance FWHM may be as narrow as 15 nm, or approximately 16 THz for the green color channel at 530 nm. This may allow the light energy to be channeled into a narrower emission bandwidth due to the effect of quicker radiative depletion of the 15 nm band of the spectral gain profile of an LED's p-n junction. That enables the spectral bandwidth of an LED display's color channel to be made narrower by using HMM structures. Narrower color channel bandwidths may result in brighter, more saturated displayed colors. Narrower color channel bandwidths may also simplify the task of focusing and redirecting the display light using wavelength-selective redirecting elements, such as diffraction gratings, for example, and may enable the use of diffractive optical elements having focusing or defocusing i.e. optical power. Furthermore, the arrayed HMM structure 208 may enable tuning of the emitted spectral bandwidth and position of maximum emission wavelength. In some embodiments, the plasmonic resonance tuning of the arrayed HMM structure 208 may also allow tuning of light extraction efficiency, which creates some interesting possibilities, such as controllable near-field apodization of a light beam emitted by the LED 200.

Figure 4:
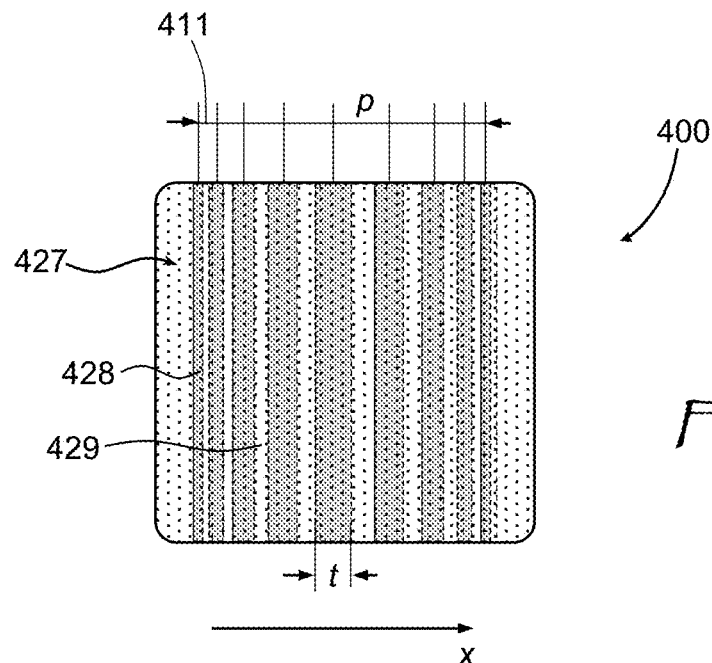
FIG. 4 is a top view of an LED with a one-dimensional MINI array having a spatially variant pitch.

Turning to FIG. 4, an LED 400 is similar to the LED 200 of FIGS. 2A and 2B in that it includes an HMM structure coupled to a quantum wells layer at a p-n junction, not shown. The HMM structure of the LED 400 includes a one-dimensional array 427 of HMM lines 428, i.e. a one-dimensional grating with the grating lines made of HMM stack of layers, e.g. a stack of alternating thin metal and dielectric layers, or a stack of alternating thin semiconductor and dielectric layers, or a stack of alternating thin metal and semiconductor layers, etc. Interline gaps 429 may be filled with the semiconductor of the second type e.g. p-type in this example. The materials and thicknesses of the layers comprising the HMM lines 428 may be selected so as to provide a desired complex dielectric permittivity of the HMM lines 428. The dielectric permittivity of the HMM lines 428 is generally polarization dependent. The grating may be a subwavelength grating having a pitch p less than wavelength of light, or a multi-order diffraction grating with the pitch p greater than the wavelength. Herein, the pitch p is defined as a distance 411 between centers of the neighboring HMM lines 428, as illustrated in FIG. 4. The optical performance of the one-dimensional array 427 of the HMM lines 428 depends not only on the complex dielectric permittivity of the HMM stack but also on the pitch p and a duty cycle d defined as $d=t/p$, where t is the line width, as shown in FIG. 4. The one-dimensional array 427 of the HMM lines 428 has a variable pitch p in going along x-axis. For subwavelength gratings, the variable pitch p may provide an optical phase of the emitted radiation variable along x-axis, which may enable configuring a far-field optical power density distribution of the LED 400. For over-wavelength gratings, i.e. diffraction gratings capable of diffracting light into a plurality of diffraction orders, the variable pitch p may provide the control of far-field light distribution of the LED 400 via non-zero diffraction orders.

Figure 5:
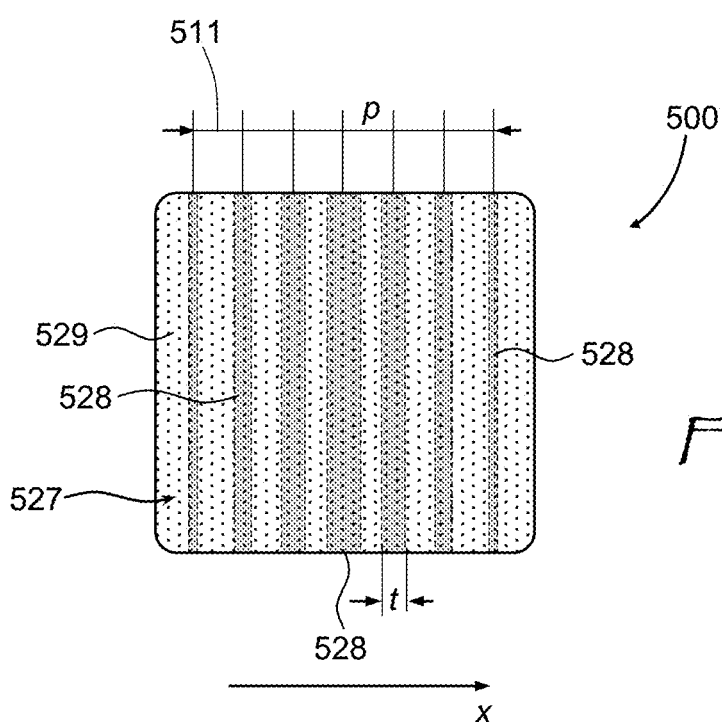
FIG. 5 is a top view of an LED with a one-dimensional MINI array having a spatially variant duty cycle.

Referring to FIG. 5, an LED 500 is similar to the LED 400 of FIG. 4 in that it includes a patterned HMM structure coupled to quantum wells layer at a p-n junction, not shown. The HMM structure of the LED 500 includes a one-dimensional array 527 of HMM grating lines 528, i.e. a one-dimensional grating with the grating lines comprising an MINI stack of layers, e.g. a stack of alternating thin metal and dielectric layers, or a stack of alternating thin semiconductor and dielectric layers, or a stack of alternating thin metal and semiconductor layers, etc. Interline gaps 529 may be filled with the semiconductor of the second type e.g. p-type. The materials and thicknesses of the layers of the MINI grating lines 428 may be selected so as to provide a desired complex dielectric permittivity of the MINI grating lines 428. The one-dimensional array 527 may be a sub-wavelength or over-wavelength grating. It is seen that the one-dimensional array 527 of the HMM grating lines 528 has a constant pitch p but variable duty cycle d defined as $d=t/p$, in going along x-axis in FIG. 5. Herein, the pitch p is defined as a distance 511 between centers of the neighboring MINI lines 528, as illustrated in FIG. 5. For subwavelength gratings, the variable duty cycle d may provide variable optical amplitude and phase of the emitted radiation, which may enable configuring a far-field optical power density distribution of the LED 500. For over-wavelength gratings, i.e. diffraction gratings capable of diffracting light into a plurality of diffraction orders, the variable pitch p may provide the control of far-field light distribution of the LED 500 via non-zero diffraction orders.

Figure 6A:
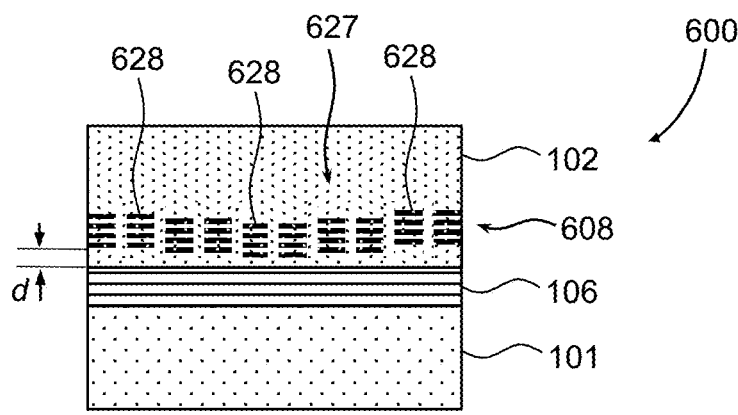
FIG. 6A is a top view of an LED with a two-dimensional MINI array having a spatially variant coupling of the HMM array features to the quantum well layer.
Figure 6B:
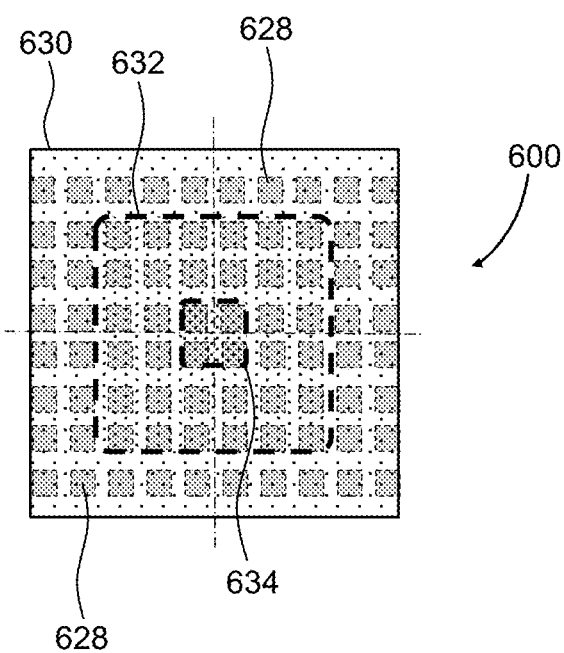
FIG. 6B is a top view of the LED of FIG. 6A.

Referring now to FIGS. 6A and 6B, an LED 600 is an embodiment of the LED 200 of FIGS. 2A and 2B. An MINI structure 608 of the LED 600 of FIGS. 6A and 6B includes a two-dimensional array 627 of HMM features 628 disposed in the second semiconductor region 102 and coupled to the quantum well layer 106. A vertical gap d between the quantum well layer 106 and the HMM features 628 of the two-dimensional array 627 varies across the two-dimensional array 627, i.e. is different in areas 630, 632, and 634 (FIG. 6B) of the two-dimensional array 627. In the embodiment shown, the vertical gap d is largest in the outmost area 630, is smallest at the center area 634, and is intermediate in the intermediate area 632. The intermediate area 632 and the center area 634 are denoted in FIG. 6B with thick dashed lines. The different levels of the MINI features 628 may be obtained by first selective etching the second semiconductor region 102 to different depth in the areas 630, 632, and 634, and depositing the HMM into the resulting multi-level structure.

Figure 6C:
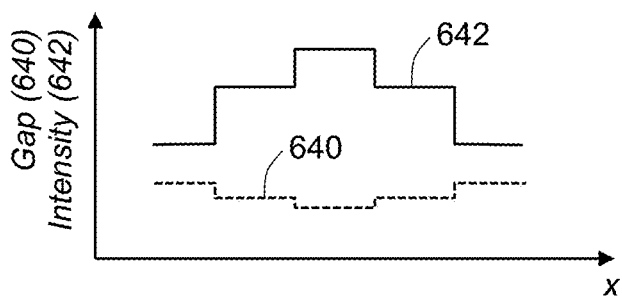
FIG. 6C is a plot of the spatially variant distance to the quantum well layer and the corresponding spatially variant coupling of the HMM array features to the quantum well layer of the LED of FIG. 6A.
Figure 7:
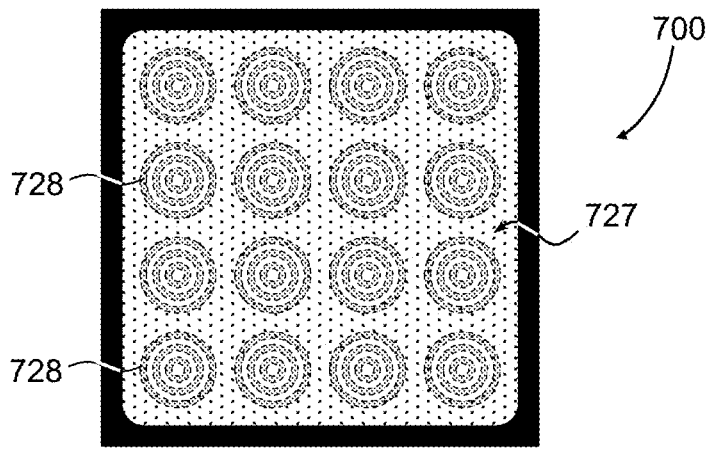
FIG. 7 is a top view of an LED with a two-dimensional MINI array having a plurality of concentric features.

FIG. 6C shows a lateral variation 640 of the vertical gap d across the LED 600. The lateral variation 640 is illustrated in FIG. 6C with dashed lines. The variable vertical gap d causes the optical coupling between the features 628 of the two-dimensional array 627 and the quantum well layer 106 to vary across the two-dimensional array 627. Smaller vertical gap d results in a stronger optical coupling, and a larger vertical gap d results in a weaker optical coupling. This is illustrated by a coupling curve 642 (solid line). Stronger coupling results in a stronger emitted light field. As a result, the light beam emitted by the LED 600 is apodized. The apodization of the light beam may suppress slidelobes of the optical far field profile, thereby making the emitted optical beam more uniform in angular power density distribution.

Dielectric properties of an HMM layer are typically polarization dependent. For example, an HMM layer may behave like a metal for optical polarization directed along the HMM surface, and like a dielectric or a semiconductor for optical polarization directed across the MINI surface. On the other hand, plasmonic resonance characteristics for small sub-wavelength features or particles may be dependent on the feature shape. Therefore, by configuring the sub-wavelength HMM features of an HMM array of features, that is, by providing a certain shape and/or orientation of the HMM features in the array of features, desired polarization properties of the emitted light may be achieved. By way of a non-limiting example, referring to FIG. 7, an LED 700 includes a two-dimensional HMM array 727 having a plurality of concentric features 728. Each concentric feature 728 may include a plurality of concentric HMM rings, and a center feature 728 may be an MINI cylinder. The concentric MINI rings may be separated by a dielectric or may be filled with the semiconductor of the second type e.g. p-type. Since the concentric features 728 are rotationally symmetric about an axis perpendicular to the emitting plane of the LED 700, the polarization of the emitted light may be circular, or may be unpolarized, depending on the geometry of the concentric features 728 of the two-dimensional HMM array 727.

Figure 8:
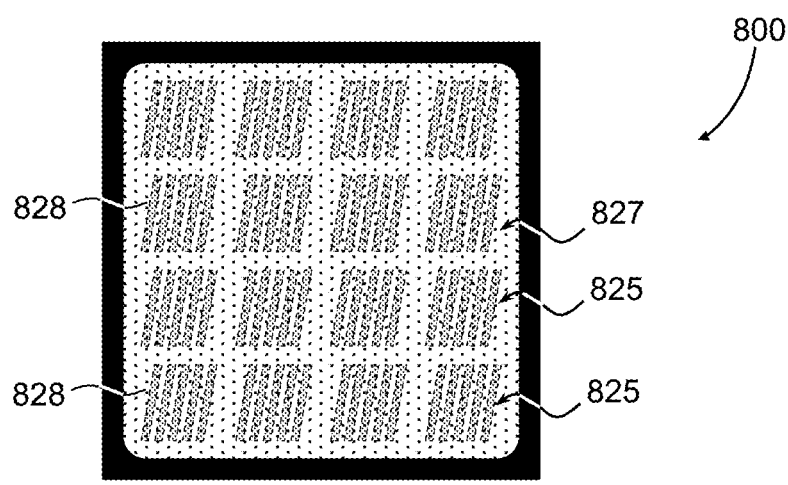
FIG. 8 is a top view of an LED with a two-dimensional HMM array having a plurality of sub-arrays of features, each sub-array including a one-dimensional array of grating lines.
Figure 9:
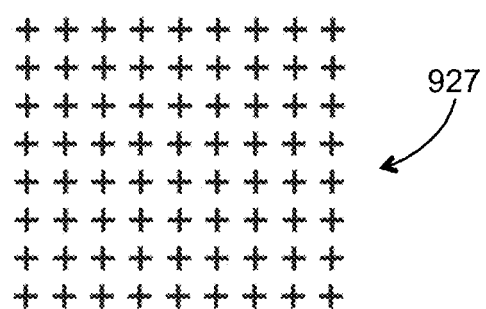
FIG. 9 is a top view of an HMM array having a plurality of cross-shaped features.

Referring to FIG. 8, an LED 800 includes a two-dimensional HMM array 827 including a plurality of sub-arrays 825 of features. Each sub-array 825 may include its own structure e.g. a linear array of grating lines 828, which may be inclined as shown. The grating lines 828 may be disposed in a dielectric or in a semiconductor region of the LED 800. The HMM array 827 may be used to provide a linear polarization of emitted light. More generally, features of an HMM array may be configured to provide a desired pre-defined polarization of emitted light.

Figure 10:
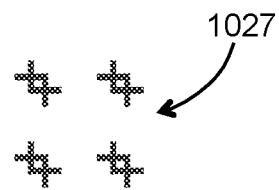
FIG. 10 is a top view of an HMM array having a plurality of intersecting chevron features.

It is noted that the HMM feature shapes described above are only non-limiting illustrative examples of the shapes that may be used. Other shapes may be used as well; for example, referring to FIG. 9, an HMM array 927 is a two-dimensional array of cross-shaped features. FIG. 10 illustrates am HMM array 1027 including arrays of chevron shapes, which may cross each other as shown, forming an array of double-chevron features. The size of the features of HMM arrays described above may be sub-microscopic. Each feature of the array is a nanoantenna having a plasmonic resonance in the optical part of electromagnetic spectrum. Plasmonic resonance of specific shapes may be computed using a suitable electromagnetic simulation software. Nanoantennas may be constructed to have a plasmonic resonance corresponding to an optical frequency of a red, green, or blue color channel in the visible part of the optical spectrum.

Figure 11A:
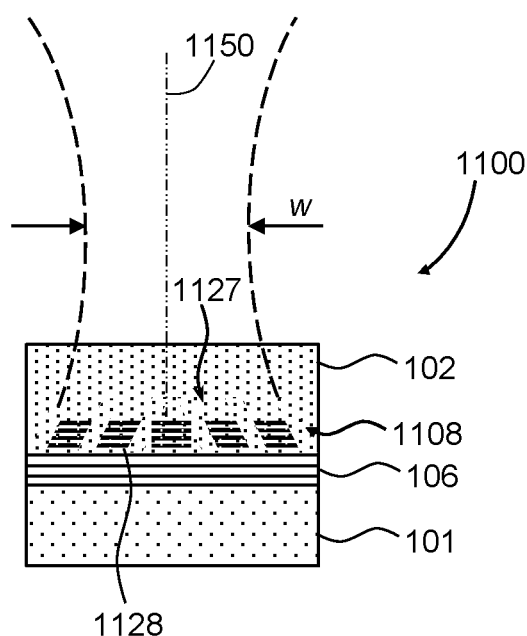
FIG. 11A is a side cross-sectional view of an LED with HMM features inclined towards the array center.
Figure 11B:
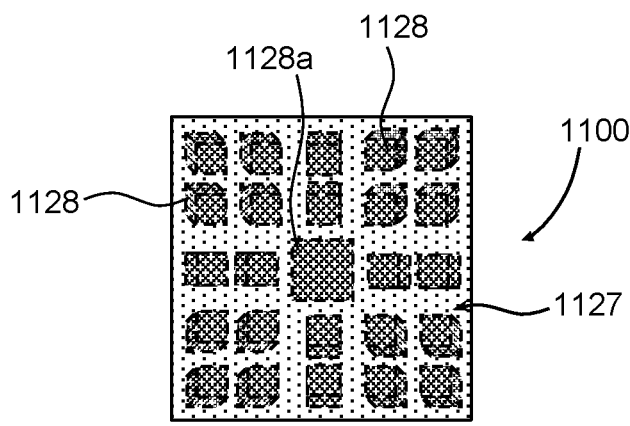
FIG. 11B is a top view of the LED of FIG. 11A.

Referring to FIGS. 11A and 11B, an LED 1100 is an embodiment of the LED 200 of FIGS. 2A and 2B and the LED 600 of FIGS. 6A and 6B. An HMM structure 1108 of the LED 1100 of FIGS. 11A and 11B includes a two-dimensional array 1127 of HMM features 1128 disposed in the second semiconductor region 102 and optically coupled to the quantum well layer 106. In some embodiments, the HMM features 1128 may extend from the quantum well layer 106. At least some of the HMM features 1128 are inclined towards a centerline 1150 of the two-dimensional array 1127 (FIG. 11A), i.e. towards a central feature 1128a of the two-dimensional array 1127 (FIG. 11B). In some embodiments, HMM features 1128 are inclined in a same direction, e.g. towards one side of the LED 1100.

In operation, each feature 1128 functions as a nanoantenna creating an optical near field propagating along the feature 1128. This causes the emitted light to focus at some distance above the LED 1100, forming a beam waist w above the LED 1100. This is an example of how shaping of individual features 1128 may enable output beam shaping, which is sometimes referred to as "chief ray engineering". The shapes of individual nanoantennas may be rectangular, rhomboidal, polygonal, circular, oval, chevron-like, etc. The nanoantennas, i.e. the features 1128, may be inclined not towards the center but all point to a certain pre-defined direction.

Figure 12:
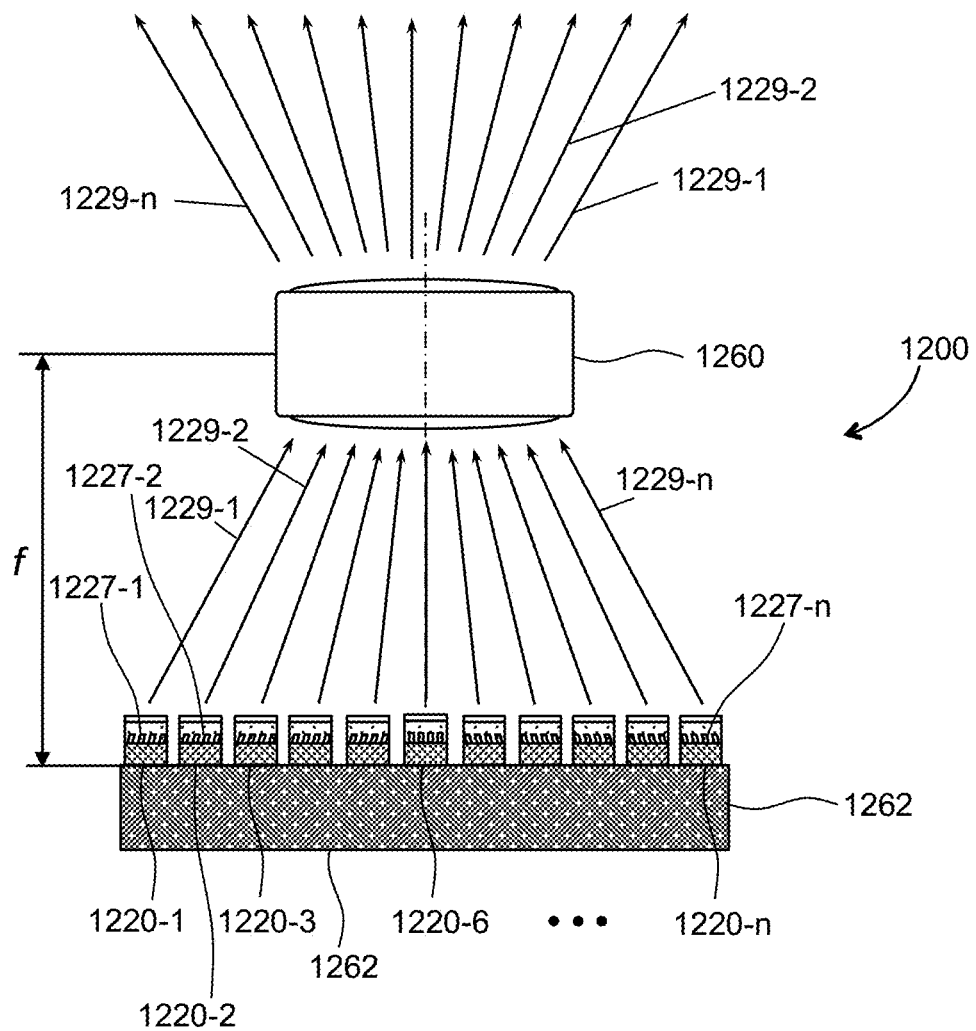
FIG. 12 is a side cross-sectional view of a display device including an array of LEDs of FIGS. 11A and 11B.

Turning to FIG. 12, a display device 1200 may use an array of LEDs 1220-1 . . . 1220-n, similar to the LED 1100 of FIGS. 11A and 11B. The array may be one- or two-dimensional. The LEDs 1220-1 . . . 1220-n may be disposed on a common substrate 1262 which can be, for example, a common n-type substrate for semiconductor junctions of the LEDs 1220-1 . . . 1220-n. The LEDs 1220-1 . . . 1220-n include respective HMM arrays 1227-1 . . . 1227-n optically coupled to respective quantum well layers, not shown. MINI arrays 1227-1 . . . 1227-n of the LEDs 1220-1 . . . 1220-n may be configured to form optical beams 1229-1 . . . 1229-n converging to a common point. An electrode structure and/or a controlling gate structure in a multiplexed drive configuration may be provided for independently energizing each LED 1220-1 . . . 1220-$n$ of the LED array. The electrode/gate structure is not shown in FIG. 12 for simplicity.

The display device 1200 further includes a collimator element having optical i.e. focusing power, e.g. a lens 1260, optically coupled to the LEDs 1220-1 . . . 1220-$n$ at the common converging point of the optical beams 1229-1 . . . 1229-$n$. The lens 1260 is spaced apart from the LEDs 1220-1 . . . 1220-$n$, e.g. by one focal length f of the lens 1260, and is configured for collimating and redirecting the optical beams 1129-1 . . . 1229-$n$. Since the optical beams 1129-1 . . . 1229-$n$ are converging to a common point, the size and weight of the lens 1260 may be considerably reduced. The individual optical beams 1129-1 . . . 1229-$n$ may also be refocused or reshaped for a better matching to the clear aperture of the lens 1260. This is an example of how chief ray engineering enables one to increase throughput while saving space, weight, and manufacturing costs of the display device 1200.

Referring now to FIGS. 13A to 13K, a manufacturing process of an LED of the present disclosure includes providing (1352; FIG. 13A) a substrate 1300, for example silicon or gallium nitride (GaN) substrate. A first semiconductor region 1301 is formed, e.g. epitaxially grown (1354; FIG. 13B), on the substrate 1300. The first semiconductor region 1301 may be of one of p- or n-conductivity types. A quantum well layer 1306 may then be epitaxially grown (1356; FIG. 13C) on the first semiconductor region 1301. The quantum well layer 1306 may include a multi-layer stack of gallium arsenide alternating with a material with a wider bandgap, like aluminum arsenide. The quantum well layers may be grown by molecular beam epitaxy or chemical vapor deposition with control of the layer thickness down to monolayers, that is, a single-atom layers of materials. Thin metal films may also support quantum well states in some cases. These are non-limiting examples of material systems that may be used.

A second semiconductor region 1302 is formed, e.g. grown (1358; FIG. 13D), on the quantum well layer 1306. The second semiconductor region 1302 may be of the other one of p- or n-conductivity types. In other words, if the first semiconductor region 1301 is of n-type, then the second semiconductor region 1302 is of p-type, and vice versa. In some embodiments, the LED 100 may be a silicon diode having n- and p-doped silicon semiconductor regions. Dopants for silicon LED 100 may include e.g. boron, gallium, aluminum, or indium (p-dopants), and arsenic, phosphorus, bismuth, antimony, or lithium (for n-dopants). The LED 100 may be also based e.g. on gallium nitride (GaN). Dopants for GaN LED 100 may include e.g. magnesium (p-dopant), and silicon, germanium, or carbon (n-dopants). These examples are non-limiting, and many other material combinations may be used.

The manufacturing process may further include forming (1360; FIG. 13E) a cavity 1380 in the second semiconductor region 1302. The cavity 1380 may be formed by a suitable etching process, e.g. reactive ion etching (RIE). A hyperbolic metamaterial (HMM) structure 1308 is then formed e.g. epitaxially grown (1362; FIG. 13F) in the cavity 1380. The HMM structure 1308 may then be patterned (1364; FIG. 13G) in the cavity 1380 to provide a one- or two-dimensional array of HMM nanoantennas described above. The patterning may be performed e.g. by a masked etching process. The second semiconductor region 1302 may then be grown back (1366; FIG. 13H) to fill the cavity 1380.

The obtained structure may then be passivated (1368; FIG. 13I) e.g. by growing a top oxide layer 1303. The passivated LED structure may be etched (1370; FIG. 13J) to crease a mesa for subsequent electrode application. Electrical contacts 1305 may then be formed (1372; FIG. 13K) through vias in the top oxide layer 1303. The electrode structure including the electrical contacts 1305 is only shown as an illustrative example.

Referring to FIGS. 14A to 14D, an alternative embodiment of forming the HMM structure 1308 is presented. The steps illustrated in FIGS. 14A to 14D replace steps 1358 to 1366 shown in FIGS. 13D to 13H. The method may include growing (1402; FIG. 14A) a first portion of the second semiconductor region 1302 to a small thickness, e.g. 1 nm to 10 nm thick, and then growing (1404; FIG. 14B) the HMM structure 1308 on the thin second semiconductor region 1302. The MINI structure 1308 may the be patterned (1406; FIG. 14C) using a suitable etching technique to provide the HMM structure 1308, which may include, for example, a one- or two-dimensional array of HMM nanoantennas described above. A second portion of the second semiconductor region 1302 may then be grown, to the full thickness of the second semiconductor region 1302 (1408; FIG. 14D) over the HMM structure 1308, as shown. It is further noted that the manufacturing methods presented above are only illustrative examples. HMM LED structures disclosed herein may be manufactured using a broad variety of methods.

Embodiments of the present disclosure may include, or be implemented in conjunction with, as light sources for an artificial reality system. An artificial reality system adjusts sensory information about outside world obtained through the senses such as visual information, audio, touch (somatosensation) information, acceleration, balance, etc., in some manner before presentation to a user. By way of non-limiting examples, artificial reality may include virtual reality (VR), augmented reality (AR), mixed reality (MR), hybrid reality, or some combination and/or derivatives thereof. Artificial reality content may include entirely generated content or generated content combined with captured (e.g., real-world) content. The artificial reality content may include video, audio, somatic or haptic feedback, or some combination thereof. Any of this content may be presented in a single channel or in multiple channels, such as in a stereo video that produces a three-dimensional effect to the viewer. Furthermore, in some embodiments, artificial reality may also be associated with applications, products, accessories, services, or some combination thereof, that are used to, for example, create content in artificial reality and/or are otherwise used in (e.g., perform activities in) artificial reality. The artificial reality system that provides the artificial reality content may be implemented on various platforms, including a wearable display such as an HMD connected to a host computer system, a standalone HMD, a near-eye display having a form factor of eyeglasses, a mobile device or computing system, or any other hardware platform capable of providing artificial reality content to one or more viewers.

Figure 15:
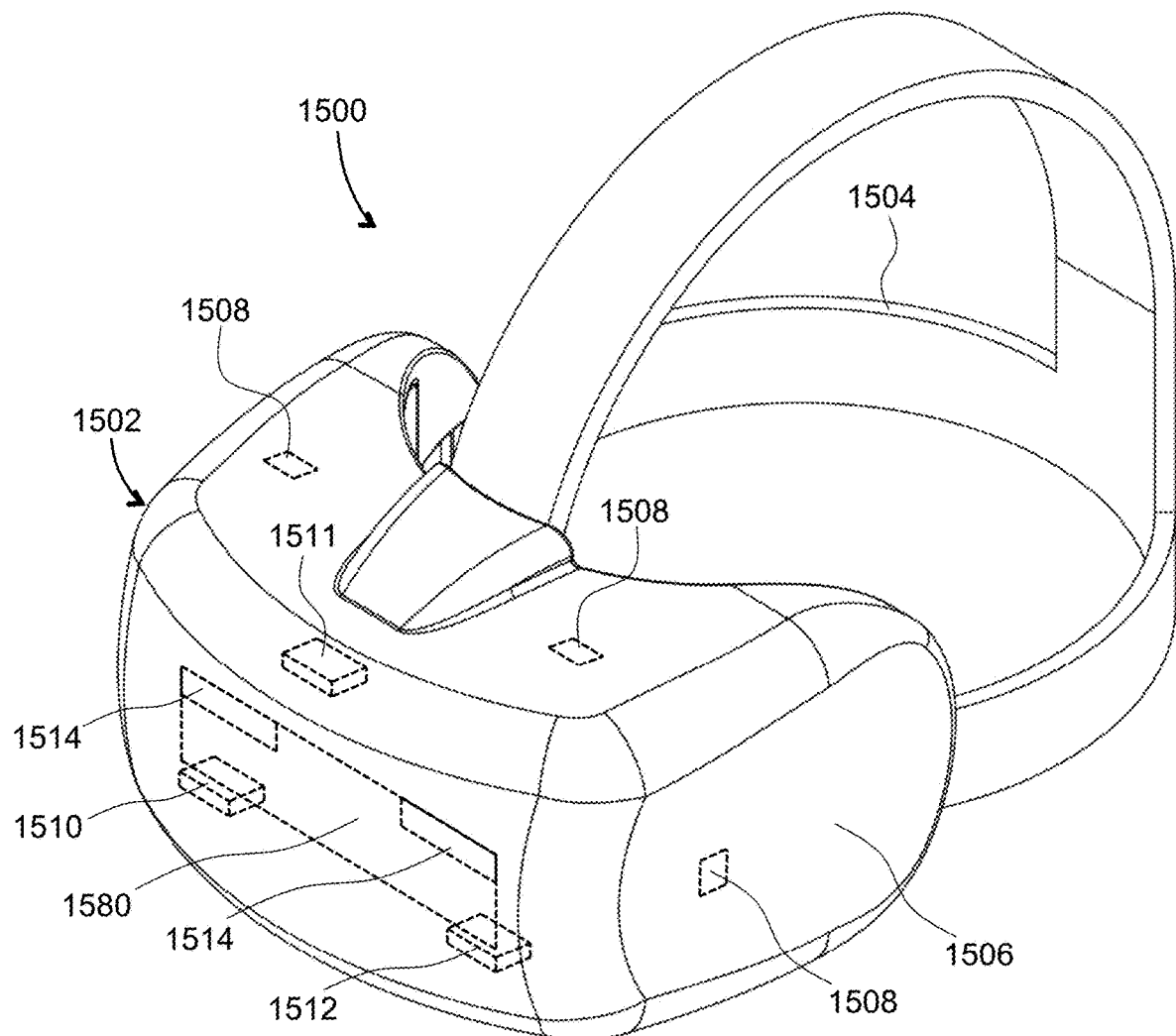
FIG. 15 is an isometric view of a head-mounted display of the present disclosure.

Referring to FIG. 15, an HMD 1500 is an example of an AR/VR wearable display system. The HMD 1500 can include any of the LEDs or display devices described herein. The LEDs may be used as light sources for illuminating the user's face, as a light source for a visual display, as display pixels, etc. The function of the HMD 1500 is to augment views of a physical, real-world environment with computer-generated imagery, and/or to generate the entirely virtual 3D imagery. The HMD 1500 may include a front body 1502 and a band 1504. The front body 1502 is configured for placement in front of eyes of a user in a reliable and comfortable manner, and the band 1504 may be stretched to secure the front body 1502 on the user's head. A display system 1580 may be disposed in the front body 1502 for presenting AR/VR imagery to the user. Sides 1506 of the front body 1502 may be opaque or transparent.

In some embodiments, the front body 1502 includes locators 1508 and an inertial measurement unit (IMU) 1510 for tracking acceleration of the HMD 1500, and position sensors 1512 for tracking position of the HMD 1500. The IMU 1510 is an electronic device that generates data indicating a position of the HMD 1500 based on measurement signals received from one or more of position sensors 1512, which generate one or more measurement signals in response to motion of the HMD 1500. Examples of position sensors 1512 include: one or more accelerometers, one or more gyroscopes, one or more magnetometers, another suitable type of sensor that detects motion, a type of sensor used for error correction of the IMU 1510, or some combination thereof. The position sensors 1512 may be located external to the IMU 1510, internal to the IMU 1510, or some combination thereof.

The locators 1508 are traced by an external imaging device of a virtual reality system, such that the virtual reality system can track the location and orientation of the entire HMD 1500. Information generated by the IMU 1510 and the position sensors 1512 may be compared with the position and orientation obtained by tracking the locators 1508, for improved tracking accuracy of position and orientation of the HMD 1500. Accurate position and orientation is important for presenting appropriate virtual scenery to the user as the latter moves and turns in 3D space.

The HMD 1500 may further include a depth camera assembly (DCA) 1511, which captures data describing depth information of a local area surrounding some or all of the HMD 1500. To that end, the DCA 1511 may include a laser radar (LIDAR), or a similar device. The depth information may be compared with the information from the IMU 1510, for better accuracy of determination of position and orientation of the HMD 1500 in 3D space.

The HMD 1500 may further include an eye tracking system 1514 for determining orientation and position of user's eyes in real time. The obtained position and orientation of the eyes also allows the HMD 1500 to determine the gaze direction of the user and to adjust the image generated by the display system 1580 accordingly. In one embodiment, the vergence, that is, the convergence angle of the user's eyes gaze, is determined. The determined gaze direction and vergence angle may also be used for real-time compensation of visual artifacts dependent on the angle of view and eye position. Furthermore, the determined vergence and gaze angles may be used for interaction with the user, highlighting objects, bringing objects to the foreground, creating additional objects or pointers, etc. An audio system may also be provided including e.g. a set of small speakers built into the front body 1502.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

The present disclosure is not to be limited in scope by the specific embodiments described herein. Indeed, other various embodiments and modifications, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. The A light-emitting diode (LED) comprising:
a first semiconductor region of one of p- or n-conductivity types;
a second semiconductor region of the other one of p- or n-conductivity types, forming a p-n junction with the first semiconductor region;
a quantum well layer at the p-n junction between the first and second semiconductor regions; and
a hyperbolic metamaterial structure in the second semiconductor region, wherein the hyperbolic metamaterial structure is coupled to the quantum well layer;
wherein the hyperbolic metamaterial structure comprises an array of features coupled to the quantum well layer, wherein at least some of the features of the array are inclined with respect to the quantum well layer.

2. The LED of claim 1, wherein the hyperbolic metamaterial structure comprises a stack of alternating metal and semiconductor layers.

3. The LED of claim 1, wherein the LED has lateral dimensions of no greater than 25×25 micrometers.

4. The LED of claim 1, wherein the array of features has a plasmonic resonance optical frequency within a spectral gain band of the quantum well layer.

5. The LED of claim 1, wherein the array of features has a spatially variant pitch.

6. The LED of claim 1, wherein the array of features has a spatially varying duty cycle.

7. The LED of claim 1, wherein a gap between the quantum well layer and features of the array varies across the array.

8. The LED of claim 1, wherein the array of features is two-dimensional.

9. The LED of claim 1, wherein each feature of the array comprises at least one of a cylinder feature, a cross feature, or a chevron feature.

10. The LED of claim 1, wherein the array comprises a plurality of sub-arrays of features, each sub-array comprising an array of grating lines.

11. The LED of claim 1, wherein the features of the array are configured to provide a pre-defined polarization of emitted light.

12. The LED of claim 1, wherein features of the array extend from the quantum well layer and into the second semiconductor region.

13. The LED of claim 1, wherein at least some of the features of the array are inclined towards a center of the array.

14. A display device comprising:
   an array of light-emitting diodes, each light-emitting diode comprising:
   a first semiconductor region of one of p- or n-conductivity types;
   a second semiconductor region of the other one of p- or n-conductivity types, forming a p-n junction with the first semiconductor region;
   a quantum well layer at the p-n junction between the first and second semiconductor regions; and
   a hyperbolic metamaterial structure in the second semiconductor region, wherein the hyperbolic metamaterial structure is coupled to the quantum well layer;
   wherein the hyperbolic metamaterial structure comprises an array of features coupled to the quantum well layer, wherein at least some of the features of the array are inclined with respect to the quantum well layer; and
   an element having optical power optically coupled to the array of light-emitting diodes and spaced apart therefrom for redirecting optical beams emitted by the array of light-emitting diodes.

15. The display device of claim 14, wherein at least some of the features of the array are inclined towards a center of the array.

16. A method of manufacturing a light-emitting diode (LED), the method comprising:
   providing a die comprising: a first semiconductor region of one of p- or n-conductivity types; a second semiconductor region of the other one of p- or n-conductivity types forming a p-n junction with the first semiconductor region; and a quantum well layer at the p-n junction between the first and second semiconductor regions; and
   forming a hyperbolic metamaterial structure in the second semiconductor region, such that:
   the hyperbolic metamaterial structure is coupled to the quantum well layer; and
   the hyperbolic metamaterial structure comprises an array of features coupled to the quantum well layer, wherein at least some of the features of the array are inclined with respect to the quantum well layer.

17. The method of claim 16, wherein forming the hyperbolic metamaterial structure in the second semiconductor region comprises forming a cavity in the second semiconductor region, wherein the hyperbolic metamaterial structure is formed in the cavity.

18. The method of claim 16, wherein forming the hyperbolic metamaterial structure in the second semiconductor region comprises growing a first portion of the second semiconductor region, forming the hyperbolic metamaterial structure on the portion, and growing a second portion of the second semiconductor region over the hyperbolic metamaterial structure.

* * * * *

UNITED STATES PATENT AND TRADEMARK OFFICE
CERTIFICATE OF CORRECTION

PATENT NO. : 10,896,994 B1
APPLICATION NO. : 16/384759
DATED : January 19, 2021
INVENTOR(S) : Shipton et al.

It is certified that error appears in the above-identified patent and that said Letters Patent is hereby corrected as shown below:

In the Claims

Column 12, Line 27, in Claim 1, "1. The A light-emitting" should read -- 1. A light-emitting --

Signed and Sealed this
Third Day of May, 2022

Katherine Kelly Vidal
*Director of the United States Patent and Trademark Office*